(12) United States Patent
Jajoo et al.

(10) Patent No.: US 10,199,998 B2
(45) Date of Patent: *Feb. 5, 2019

(54) METHOD AND SYSTEM FOR A PSEUDO-DIFFERENTIAL LOW-NOISE AMPLIFIER AT KU-BAND

(71) Applicant: Maxlinear, Inc., Carlsbad, CA (US)

(72) Inventors: Abhishek Jajoo, Carlsbad, CA (US); Vamsi Paidi, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/805,385

(22) Filed: Nov. 7, 2017

(65) Prior Publication Data

US 2018/0091104 A1 Mar. 29, 2018

Related U.S. Application Data

(63) Continuation of application No. 15/232,056, filed on Aug. 9, 2016, now Pat. No. 9,819,319, which is a (Continued)

(51) Int. Cl.
*H03F 3/45* (2006.01)
*H03F 3/195* (2006.01)
*H03F 1/52* (2006.01)

(52) U.S. Cl.
CPC ......... *H03F 3/45179* (2013.01); *H03F 1/523* (2013.01); *H03F 3/195* (2013.01); *H03F 3/45188* (2013.01); *H03F 2200/171* (2013.01); *H03F 2200/222* (2013.01); *H03F 2200/294* (2013.01); *H03F 2200/336* (2013.01); *H03F 2200/451* (2013.01);
(Continued)

(58) Field of Classification Search
CPC .. H03F 3/45179; H03F 1/523; H03F 3/45188; H03F 3/195
USPC .................................................. 330/253–261
See application file for complete search history.

(56) References Cited

U.S. PATENT DOCUMENTS

6,822,434 B2 11/2004 Haslett
7,746,169 B2 6/2010 Deng
(Continued)

*Primary Examiner* — Khanh V Nguyen
*Assistant Examiner* — Khiem Nguyen
(74) *Attorney, Agent, or Firm* — McAndrews, Held & Malloy (57) ABSTRACT

Methods and systems for a pseudo-differential low-noise amplifier at Ku-band may comprise a low-noise amplifier (LNA) integrated on a semiconductor die, where the LNA includes first and second differential pair transistors with an embedded inductor tail integrated on the semiconductor die. The embedded inductor tail may include: a first inductor with a first terminal capacitively-coupled to a gate terminal of the first differential pair transistor and a second terminal of the first inductor coupled to second, third, and fourth inductors. The second inductor may be coupled to a source terminal of the first differential pair transistor, the fourth inductor may be coupled to a source terminal of the second differential pair transistor, and the third inductor may be capacitively-coupled to a gate terminal of the second differential pair transistor and also to ground. The second inductor may be embedded within the first inductor.

20 Claims, 4 Drawing Sheets

Related U.S. Application Data continuation of application No. 14/260,214, filed on Apr. 23, 2014, now Pat. No. 9,419,569.

(60) Provisional application No. 61/815,318, filed on Apr. 24, 2013.

(52) U.S. Cl.
CPC .............. *H03F 2203/45166* (2013.01); *H03F 2203/45386* (2013.01); *H03F 2203/45464* (2013.01)

(56) References Cited

U.S. PATENT DOCUMENTS 9,419,569 B2 * 8/2016 Jajoo .................... H03F 3/45179
9,819,319 B2 * 11/2017 Jajoo .................... H03F 3/45179

\* cited by examiner

FIG. 4

METHOD AND SYSTEM FOR A PSEUDO-DIFFERENTIAL LOW-NOISE AMPLIFIER AT KU-BAND

CROSS-REFERENCE TO RELATED APPLICATIONS/INCORPORATION BY REFERENCE

This application is a continuation of U.S. patent application Ser. No. 15/232,056 filed on Aug. 9, 2016, which is a continuation of U.S. application Ser. No. 14/260,214 filed on Apr. 23, 2014, now U.S. Pat. No. 9,419,569, which makes reference to and claims priority to U.S. Provisional Application Ser. No. 61/815,318 filed on Apr. 24, 2013. Each of the above identified applications is hereby incorporated herein by reference in its entirety.

FIELD

Certain embodiments of the invention relate to semiconductor devices. More specifically, certain embodiments of the invention relate to a method and system for a pseudo-differential low-noise amplifier at Ku-band.

BACKGROUND

Complementary metal oxide semiconductor (CMOS) transistors are ubiquitous in today's electronics devices, and are often used in low-noise amplifiers for radio frequency (RF) applications.

Further limitations and disadvantages of conventional and traditional approaches will become apparent to one of skill in the art, through comparison of such systems with the present invention as set forth in the remainder of the present application with reference to the drawings.

BRIEF SUMMARY

A system and/or method for a pseudo-differential low-noise amplifier at Ku-band substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION

Certain aspects of the disclosure may be found in a pseudo-differential low-noise amplifier at Ku-band. Exemplary aspects of the invention may comprise a low-noise amplifier (LNA) integrated on a semiconductor die, where the LNA comprises differential pair transistors with an embedded inductor tail integrated on the semiconductor die. The embedded inductor tail may comprise: a first inductor with a first terminal capacitively-coupled to a gate terminal of a first transistor of the differential pair transistors and a second terminal of the first inductor coupled to second, third, and fourth inductors. The second inductor may be coupled to a source terminal of the first transistor of the differential pair transistors, the fourth inductor may be coupled to a source terminal of the second transistor of the differential pair transistors, and the third inductor may be capacitively-coupled to a gate terminal of the second transistor of the differential pair transistors and also to ground. The second inductor may be embedded within the first inductor, and the fourth inductor may be embedded within the third inductor. Cascode transistors may be coupled to drain terminals of the differential pair transistors. The cascode transistors may have inductive loads comprising inductors integrated on the semiconductor die. The differential pair transistors and the cascode transistors may comprise complementary metal-oxide semiconductor (CMOS) transistors. The first inductor may be capacitively-coupled to the gate of the first transistor of the differential pair transistors and the fourth inductor may be capacitively-coupled to the gate of the second transistor of the differential pair transistors utilizing CMOS capacitors. The LNA may receive a single-ended signal and generate a differential output signal. The embedded inductor tail may provide electro-static discharge (ESD) protection for the LNA. The semiconductor die may be bonded to a packaging substrate.

As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be implemented in hardware, software, firmware, or any combination of one or more thereof. As utilized herein, the term "exemplary" means serving as a non-limiting example, instance, or illustration. As utilized herein, the term "e.g.," introduces a list of one or more non-limiting examples, instances, or illustrations.

Figure 1:
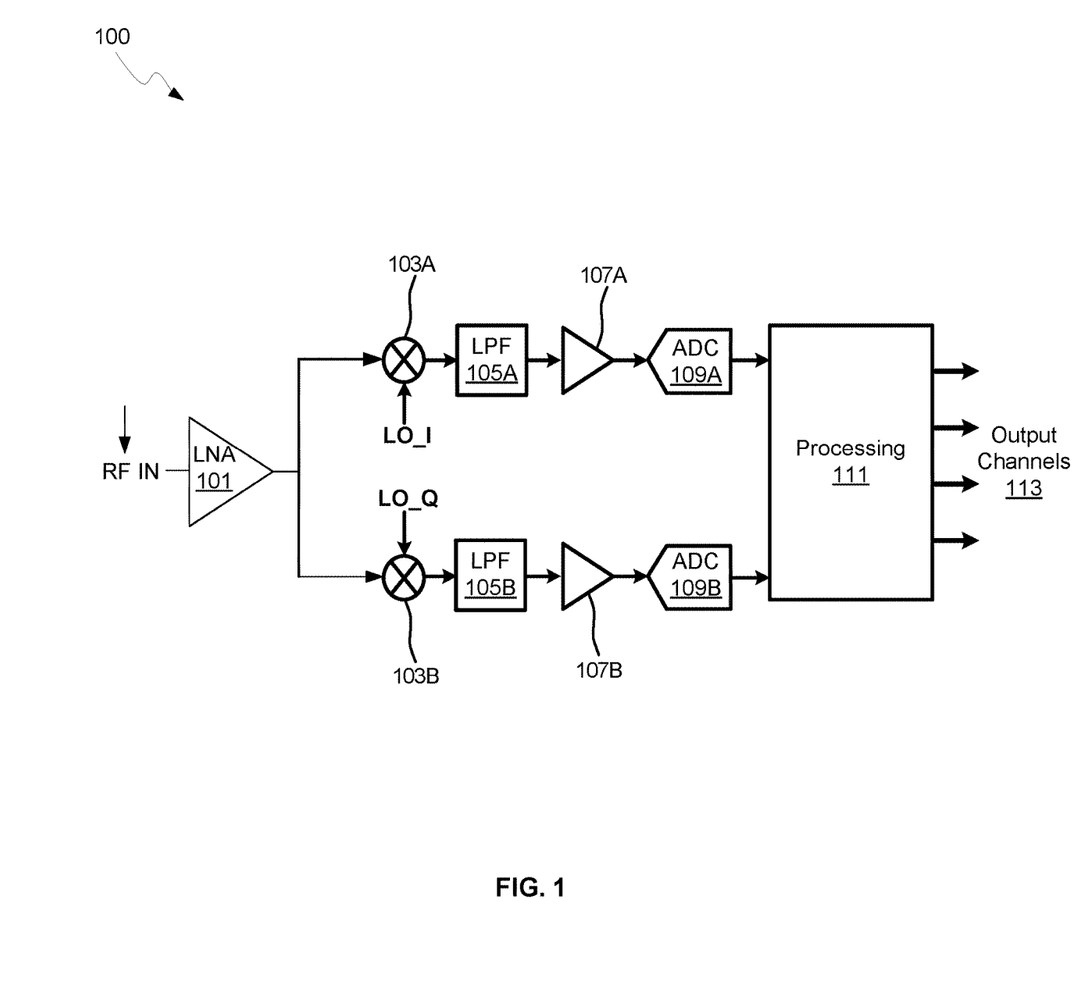
FIG. 1 is a diagram illustrating an example receiver with a pseudo-differential low-noise-amplifier, in accordance with an example embodiment of the disclosure.

FIG. 1 is a diagram illustrating an example receiver with a pseudo-differential low-noise-amplifier, in accordance with an example embodiment of the disclosure. Referring to FIG. 1, there is shown a receiver 100 comprising a pseudo-differential low-noise amplifier (LNA) 101, in-phase (I) and quadrature (Q) mixers 103A and 103B, local oscillator signals LO_I and LO_Q, gain stages 107A and 107B, analog-to-digital converters (ADCs) 109A and 109B, and a processing module 111. There is also shown an input signal RF IN.

The LNA 101 may be operable to provide amplification to the input signal RF IN with the amplified signal being communicated to the mixers 103A and 103B. The LNA 101 may comprise a pseudo-differential LNA in that a single-ended input signal received by the LNA 101 may be output as an amplified differential signal without the need for a balun to convert to a differential signal. The differential output signal may be communicated to the I and Q mixers 103A and 103B.

The mixers 103A and 103B may comprise circuitry that is operable to generate output signals at frequencies that are the sum and the difference between the input RF signal RF In and the local oscillator signal, which comprises either LO_I or LO_Q. The signal RF In may be down-converted to in-phase and quadrature signals in the receiver 100 utilizing the 90 degree phase difference LO signals LO_I and LO_Q. The frequency of LO_I and LO_Q may be configured such that it is centered within desired channels. The local oscillators signals LO_I And LO_Q may be generated by voltage-controlled oscillators in a phase-locked loop, for example, where the frequency of oscillation may be configured by a control voltage.

The low-pass filters 105A and 105B may comprise circuitry that is operable to attenuate signals above a corner frequency and allow signals below the corner frequency to pass. In this manner, sum frequency signals from the mixers 103A and 103B may be filtered while difference frequency signals may be allowed to pass through to the gain modules 107A and 107B.

The gain modules 107A and 107B may comprise amplifiers for amplifying the down-converted and filtered signals. The gain modules 107A and 107B may comprise configurable gain levels, and may be controlled by the processing module 111, for example. In another example scenario, the LNA 101 may comprise a conventional single-ended LNA and the gain modules 107A and 107B may comprise pseudo-differential LNAs, as described for the LNA 101 above.

The ADCs 109A and 109B may comprise circuitry that is operable to convert analog input signals to digital output signals. Accordingly, the ADCs 109A and 109B may receive baseband analog signals from the gain modules 107A and 107B and may generate digital signals to be communicated to the processing module 111. In another example scenario where the input signal, RF IN, is a digital signal, the ADCs 109A and 109B would then not be needed, and the processing of received signals would be in the digital domain.

The processing module 111 may comprise a processor that is operable to control the functions of the receiver 200 and may process received baseband signals to demodulate, deinterlace, and/or perform other processing techniques to the data.

Figure 3:
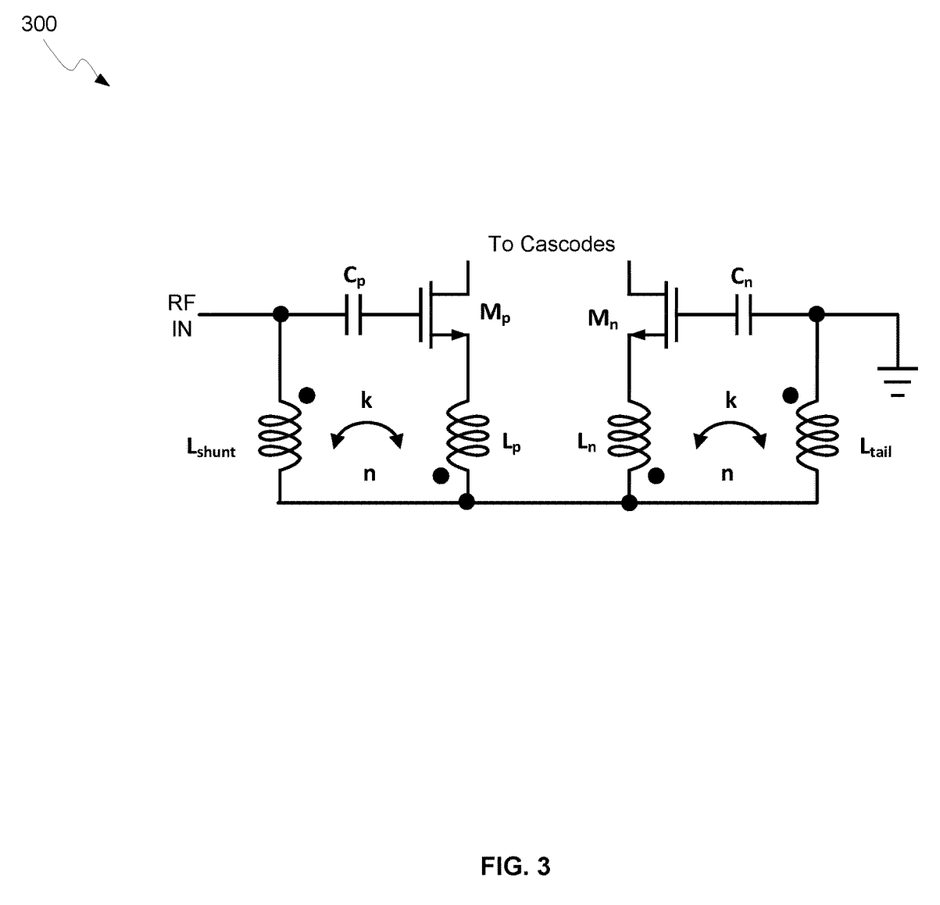
FIG. 3 illustrates an example impedance matching and electro-static discharge structure for a pseudo-differential low-noise amplifier, in accordance with an example embodiment of the disclosure.
Figure 4:
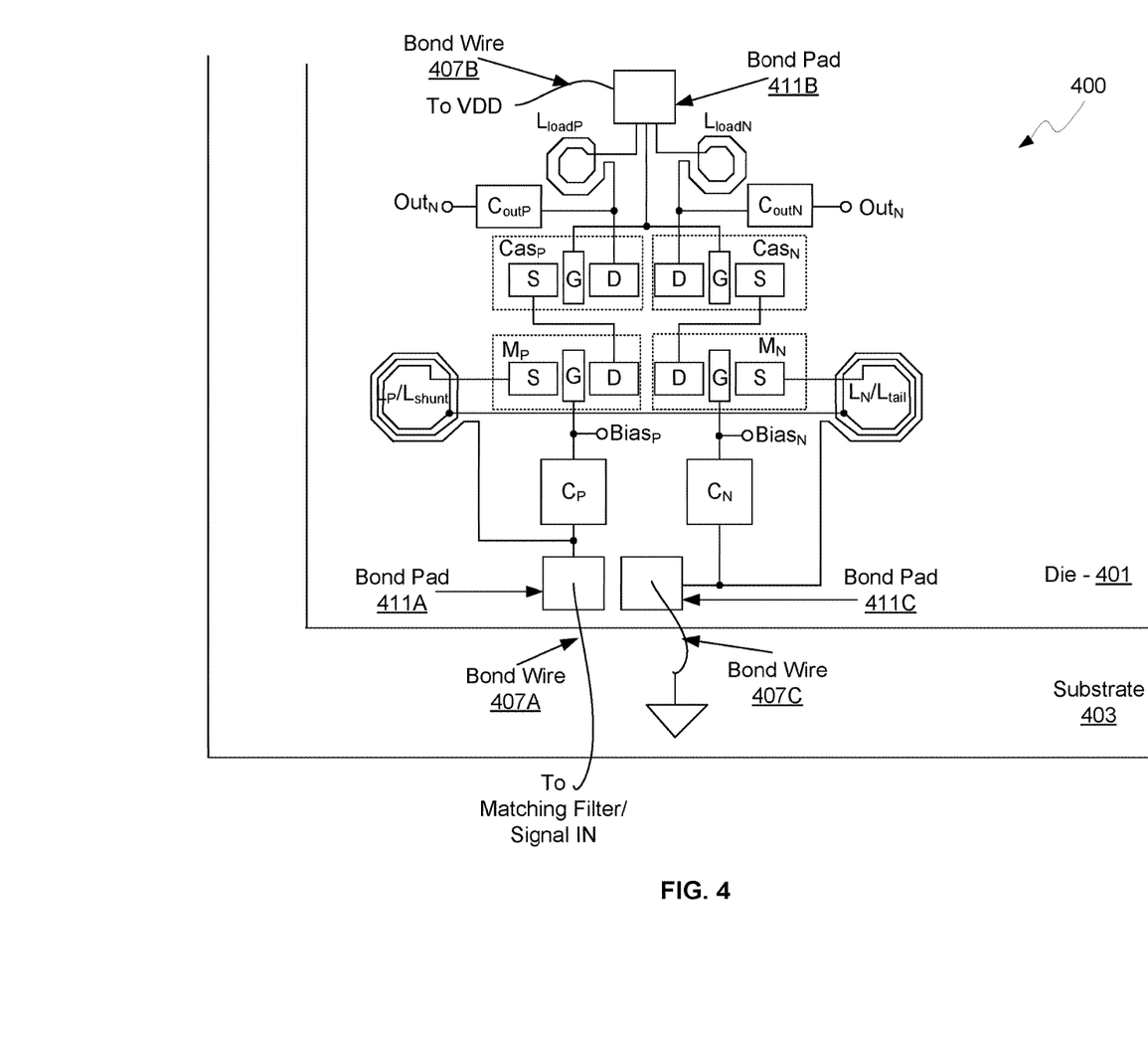
FIG. 4 illustrates an example layout of a pseudo-differential low-noise amplifier, in accordance with an example embodiment of the disclosure.

In an example scenario, the receiver 100 may be operable to receive and process signals in the Ku-band, in the 10-18 GHz range, for example, where an inductive tail may be utilized for differential pair transistors in the LNA 101, as opposed to an active tail with its high capacitance or a resistive tail with its large voltage drop. In addition, for proper differential mode operation with signal balance at the output, impedances should be matched at the inputs to differential pairs in the LNA, which is enabled by the inductive tail circuitry as shown in FIGS. 2-4.

Figure 2:
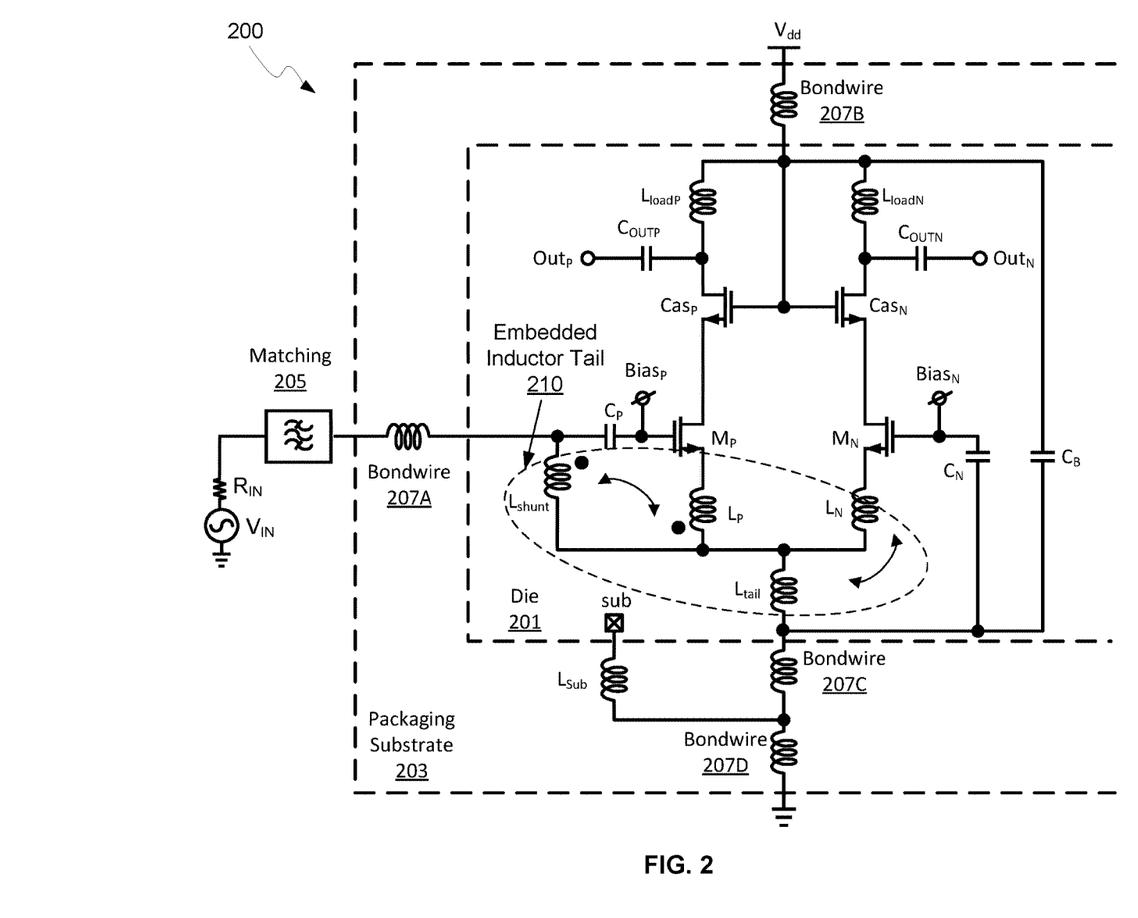
FIG. 2 is a schematic of an example pseudo-differential low-noise amplifier, in accordance with an example embodiment of the disclosure.

FIG. 2 is a schematic of an example pseudo-differential low-noise amplifier, in accordance with an example embodiment of the disclosure. Referring to FIG. 2, there is shown a pseudo-differential LNA 200 that is integrated on a die 201 and a packaging substrate 203. The die 201 may comprise a CMOS integrated circuit, for example, but is not necessarily limited to CMOS as other technology transistors may be used, including compound semiconductor or organic circuits. The LNA 200 may be considered "pseudo-differential" in that it may receive a single-ended input and generate a differential output, which is achieved without the use of a balun.

The die 201 may be bonded to the packaging substrate utilizing a conductive paste or epoxy, which provides a conductive path to the substrate in which the devices in the die 201 are integrated. The die 201 may comprise active devices such as the CMOS transistors $M_P$, $M_N$, $Cas_P$, and $Cas_N$, and passive devices such as the capacitors $C_P$, $C_N$, $C_{OUTP}$, $C_{OUTN}$, and $C_B$, and inductors $L_{loadP}$, $L_{loadN}$, $L_{shunt}$, $L_P$, $L_N$, and $L_{tail}$. The capacitors $C_P$, $C_N$, $C_{OUTP}$, $C_{OUTN}$, and $C_B$ may comprise CMOS capacitors, i.e. CMOS transistors with coupled source and drain, or parallel plate capacitor structures, for example. The inductor $L_{Sub}$ may comprise a modeling inductance representing the packaging substrate inductance.

The CMOS transistors $M_P$ and $M_N$ may comprise the differential pair input to the LNA 200 and the drain terminals of the CMOS cascode transistors $Cas_P$ and $Cas_N$ may provide the differential output of the LNA 200 through the output capacitors $C_{OUTP}$ and $C_{OUTN}$. The gate terminals of the differential pair transistors may be biased by the bias voltages $Bias_P$ and $Bias_N$ to configure the transistors $M_P$ and $M_N$ in the desired mode, while $V_{DD}$ and ground may be supplied via the bond wires 207B and 207C/207D, respectively.

The input capacitors $C_P$ and $C_N$ may provide capacitive coupling, i.e., AC-coupling, to the differential pair transistors $M_P$ and $M_N$. The gate of the CMOS transistor $M_N$ may be coupled to ground through $C_N$ via the bond wires 207C and 207D, while the gate of the CMOS transistor $M_P$ may receive the input signal, illustrating the single-ended input configuration of the LNA 200.

The input signal may be supplied by the voltage supply $V_{IN}$ via the input resistor $R_{IN}$ and the matching filter 205, which may comprise a band-pass or notch-pass filter operable to remove unwanted signals while allowing a desired signal or signals to pass. In addition, the matching circuit 205 may comprise impedance matching capability for matching the impedance of the source of the input signal, $V_{IN}$ and $R_{IN}$, to the LNA 200, for improved input signal power transfer of the input signal to the LNA 200.

As stated above, an inductive tail may be preferred for differential pairs operating in the Ku-band, as an active tail current source would have a high capacitance associated with it, and a resistive tail would excessive voltage drop. When no balun is present in the signal path, single-ended to differential conversion may be realized by connecting one of the inputs of the differential pair to AC ground.

In order to have a good signal balance at the output of a differential amplifier, it is important to have the same impedance matching network at both the inputs. Therefore, in an example embodiment of the disclosure, the inductors $L_{shunt}$, $L_P$, $L_N$, and $L_{tail}$ comprising an embedded inductor tail 210 may be integrated together on the die 201 for highly reproducible uniformity, and in instances of inductively coupled pairs, such as $L_{tail}/L_N$ and $L_{shunt}/L_P$, may be integrated one within the other, i.e. embedded inductors. For example, $L_P$ may be embedded within $L_{shunt}$ while $L_N$ may be embedded within $L_{tail}$, as illustrated by the mutual inductance arrows in FIG. 2, and shown further with respect to FIG. 4.

This embedded integration of nominally identical inductor pairs provides the same matching network at both the inputs of the differential pair $M_P$ and $M_N$, which improves the differential nature, such as common-mode rejection ratio and signal magnitude and phase match, of the signal at the outputs $O_{utP}$ and $O_{utN}$ of the LNA 200. In addition to providing a low impedance connection to the LNA 200, the inductors comprising the bond wires 207A-207D and the inductors $L_{tail}/L_N$ and $L_{shunt}/L_P$ may provide electro-static discharge (ESD) protection for the LNA 200, shorting high voltage spikes to ground as well as resisting large current spikes.

In operation, a Ku-band signal may be generated by voltage source $V_{IN}$, filtered by the matching filter 205, and communicated to the die 201 via the bond wire 207A and capacitively-coupled to the input transistor $M_P$ of the LNA 200. The embedded inductor tail 210 may shunt any voltage spikes to ground, thereby providing ESD protection to the LNA 200. In addition, the embedded inductor tail provides a high-frequency tail for the LNA 210 with excellent differential output performance due to the matched embedded coils $L_{tail}/L_N$ and $L_{shunt}/L_P$.

The cascode configuration of transistors $Cas_P$ and $Cas_N$ may provide a high output resistance for the differential pairs $M_P$ and $M_N$. The cascode transistors CasP and CasN may be biased at $V_{DD}$. The output of the LNA 200, at $Out_P$ and $Out_N$, may be a differential signal that is AC-coupled out of the LNA 200 by the output capacitors $C_{OUTP}$ and $C_{OUTN}$. While the LNA 200 may be tuned for Ku-band operation, it is not so limited and may be used at any desired frequency as determined by LNA bandwidth and input impedances utilized, for example.

FIG. 3 illustrates an example impedance matching and electro-static discharge structure for a pseudo-differential low-noise amplifier, in accordance with an example embodiment of the disclosure. Referring to FIG. 3, there is shown a differential pair $M_P$ and $M_N$ with input capacitors $C_P$ and $C_N$ for AC-coupling, i.e., capacitive-coupling. The coupling capacitor $C_N$ may be coupled to ground while $C_P$ provides an input terminal for the circuit.

The inductor pairs $L_{tail}/L_N$ and $L_{shunt}/L_P$ may be integrated and co-located on a semiconductor die, with $L_P$ embedded in $L_{shunt}$ and $L_n$ embedded in $L_{tail}$, as described with respect to FIG. 2 and shown further in FIG. 4. In this configuration, the input impedance seen at RF IN may be given by:

$$\text{Re}\{Z_{in}\} \approx \frac{2*k*g_m}{n}$$

where $g_m$ is the transconductance of the differential pair transistors, and k is the mutual inductance factor of the inductor pairs, and n is the turns ratio of the inductor pairs. With equivalent turns ratio n, transistor transconductance, and mutual inductance of the inductor pairs as afforded by embedding inductors adjacent on the same die, the differential performance may be greatly increased over conventional LNA designs. While the LNA disclosed may be tuned for Ku-band operation, it is not so limited and may be used at any desired frequency as determined by LNA bandwidth and input impedances utilized, for example.

FIG. 4 illustrates an example layout of a pseudo-differential low-noise amplifier, in accordance with an example embodiment of the disclosure. Referring to FIG. 4, there is shown LNA 400 integrated on a die 401, which may be bonded to a packaging substrate 403. FIG. 4 also shows bond wires 407A-407C and bond pads 411A-411C for providing electrical contact to the die 401. The die 401 may comprise a CMOS integrated circuit, for example, but is not necessarily limited to CMOS as other technology transistors may be used, including compound semiconductor or organic circuits.

The die 401 may be bonded to the packaging substrate utilizing a conductive paste or epoxy that provides a conductive path to the substrate in which the devices in the die 401 are integrated. The die 401 may comprise active devices such as the CMOS transistors $M_P$, $M_N$, $Cas_P$, and $Cas_N$, and passive devices such as the capacitors $C_P$, $C_N$, $C_{OUTP}$, and $C_{OUTN}$, and inductors $L_{loadP}$, $L_{loadN}$, $L_{shunt}$, $L_P$, $L_N$, and $L_{tail}$.

The CMOS transistors $M_P$ and $M_N$ may comprise the differential pair input to the LNA 400 and the drain terminals of the CMOS cascode transistors $Cas_P$ and $Cas_N$ may provide the differential output of the LNA 400 through the output capacitors $C_{OUTP}$ and $C_{OUTN}$. The gate, source, and drain terminals of the CMOS transistors are labeled G, S, and D, respectively. The supply voltage $V_{DD}$ may be supplied via the wire bond 407B coupled to the bond pad 411B and ground may be supplied via the wire bond 407C to the substrate 403.

The layout shown in FIG. 4 is a simplified layout schematic, where the relative sizes of the structures are not necessarily to scale, and for some structures may be exaggerated for clarity purposes. Similarly, the spaces between devices may also be exaggerated for clarity. The inductor pairs $L_{shunt}/L_P$ and $L_N/L_{tail}$ illustrate the co-located, or embedded inductor integration where one inductor of each pair is embedded within the other inductor of the pair. Since these inductor pairs and capacitors $C_P$ and $C_N$ are located in close proximity on the die 401 (the differential pair CMOS transistors $M_P$ and $M_N$ are exaggerated in size exaggerating the distance between the inductor pairs), the impedances on each side of the differential pair may be essentially equivalent, providing improved differential performance.

In an example scenario, FIG. 4 illustrates a possible layout for the LNA 200 described in FIG. 2. Accordingly, a terminal of the input capacitors $C_P$ and $C_N$ may be coupled to the gate terminals of the differential pair CMOS transistors $M_P$ and $M_N$ and the drain terminals of $M_P$ and $M_N$ may be coupled to the source terminals of the CMOS cascode transistors $Cas_P$ and $Cas_N$.

The second terminal of capacitor $C_N$ may be coupled to the inductor $L_{tail}$ and the bond pad 411C, which may be coupled to ground via the bond wire 407C. The source terminals of the differential pair CMOS transistors $M_P$ and $M_N$ may be coupled to first terminals of the embedded inductors $L_P$ and $L_N$. The second terminal of Inductor LP may be coupled to inductors $L_{shunt}$, $L_{tail}$, and $L_N$.

The gate terminals of the CMOS cascode transistors $Cas_P$ and $Cas_N$ may be coupled to the bond pad 411B for biasing the gates using the supply voltage $V_{DD}$. The drain terminals of the CMOS cascode transistors $Cas_P$ and $Cas_N$ may be coupled to the load inductors $L_{loadP}$ and $L_{loadN}$ and to the output capacitors $C_{outP}$ and $C_{outN}$. The load inductors $L_{loadP}$ and $L_{loadN}$ may also be coupled to $V_{DD}$.

The arrangement of capacitors, CMOS transistors, and embedded inductors in close proximity may provide improved differential performance of the LNA 400. In addition, the shunt arrangement of the inductors at the inputs of the LNA 400, and as illustrated for the LNAs 200 and 300 in FIGS. 2 and 3, provide ESD protection for the LNA. While the LNA 400 may be tuned for Ku-band operation, it is not so limited and may be used at any desired frequency as determined by LNA bandwidth and input impedances utilized, for example.

In an embodiment of the disclosure, a method and system may comprise a low-noise amplifier (LNA) integrated on a semiconductor die, where the LNA comprises differential pair transistors with an embedded inductor tail integrated on the semiconductor die. The embedded inductor tail may comprise: a first inductor with a first terminal capacitively-coupled to a gate terminal of a first transistor of the differential pair transistors and a second terminal of the first inductor coupled to second, third, and fourth inductors.

The second inductor may be coupled to a source terminal of the first transistor of the differential pair transistors, the fourth inductor may be coupled to a source terminal of the second transistor of the differential pair transistors, and the third inductor may be capacitively-coupled to a gate terminal of the second transistor of the differential pair transistors and also to ground. The second inductor may be embedded within the first inductor, and the fourth inductor may be embedded within the third inductor. Cascode transistors may be coupled to drain terminals of the differential pair transistors.

The cascode transistors may have inductive loads comprising inductors integrated on the semiconductor die. The differential pair transistors and the cascode transistors may comprise complementary metal-oxide semiconductor (CMOS) transistors. The first inductor may be capacitively-coupled to the gate of the first transistor of the differential pair transistors and the fourth inductor may be capacitively-coupled to the gate of the second transistor of the differential pair transistors utilizing CMOS capacitors. The LNA may receive a single-ended signal and generate a differential output signal. The embedded inductor tail may provide electro-static discharge (ESD) protection for the LNA. The semiconductor die may be bonded to a packaging substrate.

Other embodiments may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for a pseudo-differential low-noise amplifier at Ku-band.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A semiconductor device, the device comprising:
    a low-noise amplifier (LNA) integrated on a semiconductor die, the LNA comprising a first differential pair transistor, a second differential pair transistor, and embedded inductors integrated on the semiconductor die, wherein the embedded inductors comprise:
        a first inductor with a first terminal capacitively-coupled to a gate terminal of the first differential pair transistor and with a second terminal coupled to second, third, and fourth inductors, wherein the second inductor is coupled to a source terminal of the first differential pair transistor, the fourth inductor is coupled to a source terminal of the second differential pair transistor, and the third inductor is capacitively-coupled to a gate terminal of the second differential pair transistor.

2. The device according to claim 1, wherein the second inductor is embedded within the first inductor.

3. The device according to claim 1, wherein the fourth inductor is embedded within the third inductor.

4. The device according to claim 1, wherein cascode transistors are coupled to drain terminals of the first and second differential pair transistors.

5. The device according to claim 4, wherein the cascode transistors have inductive loads comprising inductors integrated on the semiconductor die.

6. The device according to claim 4, wherein the first and second differential pair transistors and the cascode transistors comprise complementary metal-oxide semiconductor (CMOS) transistors.

7. The device according to claim 1, wherein the first inductor is capacitively-coupled to the gate of the first differential pair transistor and the fourth inductor is capacitively-coupled to the gate of the second differential pair transistor utilizing CMOS capacitors.

8. The device according to claim 1, wherein the LNA is operable to receive a single-ended signal and generate a differential output signal.

9. The device according to claim 1, wherein the embedded inductors are operable to provide electro-static discharge (ESD) protection for the LNA.

10. The device according to claim 1, wherein the semiconductor die is bonded to a packaging substrate.

11. A method for communication, the method comprising:
    in a low-noise amplifier (LNA) integrated on a semiconductor die, the LNA comprising a first differential pair transistor, a second differential pair transistor, and embedded inductors integrated on the semiconductor die,
        amplifying a radio frequency (RF) signal, wherein the embedded inductors comprise:
            a first inductor with a first terminal capacitively-coupled to a gate terminal of the first differential pair transistor and with a second terminal coupled to second, third, and fourth inductors, wherein the second inductor is coupled to a source terminal of the first differential pair transistor, the fourth inductor is coupled to a source terminal of the second differential pair transistor, and the third inductor is capacitively-coupled to a gate terminal of the second differential pair transistor.

12. The method according to claim 11, wherein the second inductor is embedded within the first inductor.

13. The method according to claim 11, wherein the fourth inductor is embedded within the third inductor.

14. The method according to claim 11, wherein cascode transistors are coupled to drain terminals of the first and second differential pair transistors.

15. The method according to claim 14, wherein the cascode transistors have inductive loads comprising inductors integrated on the semiconductor die.

16. The method according to claim 14, wherein the first and second differential pair transistors and the cascode transistors comprise complementary metal-oxide semiconductor (CMOS) transistors.

17. The method according to claim 11, wherein the first inductor is capacitively-coupled to the gate of the first differential pair transistor and the fourth inductor is capacitively-coupled to the gate of the second differential pair transistor utilizing CMOS capacitors.

18. The method according to claim 17, comprising generating a differential output signal from the received RF signal using the LNA.

19. The method according to claim 11, comprising providing electro-static discharge (ESD) protection for the LNA utilizing the embedded inductors.

20. A semiconductor device comprising:
a low-noise amplifier (LNA) integrated on a complementary metal-oxide semiconductor (CMOS) die, the LNA comprising a first differential pair transistor, a second differential pair transistor, and embedded inductors integrated on the semiconductor die, wherein the embedded inductors comprise:
a first inductor with a first terminal capacitively-coupled to a gate terminal of the first differential pair transistor and with a second terminal coupled to second, third, and fourth inductors, wherein the second inductor is coupled to a source terminal of the first differential pair transistor, the fourth inductor is coupled to a source terminal of the second differential pair transistor, the third inductor is capacitively-coupled to a gate terminal of the second differential pair transistor, and wherein a differential output of the LNA is provided at drain terminals of cascode transistors coupled to drain terminals of the first and second differential pair transistors.

* * * * *